United States Patent
Takeda et al.

(10) Patent No.: US 7,282,747 B2
(45) Date of Patent: Oct. 16, 2007

(54) LIGHT EMITTING MODULE AND LAMP

(75) Inventors: Hitoshi Takeda, Shizuoka (JP);
Hisayoshi Daichou, Shizuoka (JP);
Tsukasa Tokida, Shizuoka (JP);
Hiroyuki Ishida, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 204 days.

(21) Appl. No.: 11/033,872

(22) Filed: Jan. 13, 2005

(65) Prior Publication Data

US 2005/0157508 A1 Jul. 21, 2005

(30) Foreign Application Priority Data

Jan. 21, 2004 (JP) ............... 2004-013123

(51) Int. Cl.
*H01L 29/22* (2006.01)
*H01L 29/24* (2006.01)

(52) U.S. Cl. ............... 257/98; 257/95; 257/81; 257/99; 257/100

(58) Field of Classification Search ............... 257/95, 257/98, 81, 99, 100, E33.058, E33.059; 313/498–500
See application file for complete search history.

(56) References Cited

U.S. PATENT DOCUMENTS

| | | | |
|---|---|---|---|
| 6,367,949 B1 * | 4/2002 | Pederson | 362/240 |
| 6,614,172 B2 * | 9/2003 | Chiu et al. | 313/501 |
| 6,614,179 B1 | 9/2003 | Shimizu et al. | |
| 2002/0121645 A1 * | 9/2002 | Yasukawa et al. | 257/99 |
| 2002/0191880 A1 * | 12/2002 | Borrelli et al. | 385/11 |
| 2006/0163683 A1 * | 7/2006 | Roth et al. | 257/432 |

OTHER PUBLICATIONS

Ohm MOOK Light Series, No. 1, "Optical Device", ohm-sha, Nov. 25, 2001, 18 pages.

* cited by examiner

*Primary Examiner*—Kenneth Parker
*Assistant Examiner*—Joseph Nguyen
(74) *Attorney, Agent, or Firm*—Sughrue Mion, PLLC

(57) ABSTRACT

A light-emitting module having a light-emitting efficiency. The light-emitting module that emits light includes a semiconductor light-emitting element operable to emit light, and a sealing member operable to seal the semiconductor light-emitting element with materials that transmit the light emitted from the light-emitting module, in which the semiconductor light-emitting element includes a sapphire substrate that transmits light toward the sealing member to send the transmitted light from a facing face facing the sealing member and forms a sub-wavelength grating for reducing reflection of light on the facing face in grid periods shorter than a wavelength of the light transmitted through the sapphire substrate, and a semiconductor layer that is formed on a rear face of the facing face in the sapphire substrate by crystal growth and emits light toward the sapphire substrate.

12 Claims, 10 Drawing Sheets

REFRACTIVE INDEX

LIGHT EMITTING MODULE AND LAMP

This patent application claims priority from a Japanese Patent Application No. 2004-013123 filed on Jan. 21, 2004, the contents of which are incorporated herein by reference.

BACKGROUND OF THE INVENTION

1. Field of the Invention

The present invention relates to a light-emitting module and a lamp.

2. Description of Related Art

In a light-emitting module such as a light-emitting diode module, a semiconductor light-emitting element is sealed by a sealing member that is formed of resin having light transmittance in order to improve light-emitting efficiency (e.g., see OhmMOOK Light series No. 1 "Optical device", Ohm-sha, Nov. 25, 2001). In this case, the sealing member is formed of materials having a refractive index that is larger than that of air and smaller than that of a semiconductor light-emitting element.

However, when a refractive index of the sealing member is high, total reflection of light occurs on an interface between the sealing member and air. For that purpose, light could not conventionally be sent from the sealing member to air with high efficiency in some cases. In this way, it was not possible to efficiently utilize light emitted from a light-emitting module in some cases.

SUMMARY OF THE INVENTION

Therefore, it is an object of the present invention to provide a light-emitting module and a lamp that can solve the foregoing problems. The above and other objects can be achieved by combinations described in the independent claims. The dependent claims define further advantageous and exemplary combinations of the present invention.

According to the first aspect of the present invention, there is provided a light-emitting module that emits light. The light-emitting module includes: a semiconductor light-emitting element operable to emit light; and a sealing member operable to seal the semiconductor light-emitting element with materials that transmit the light emitted from the light-emitting module, in which the semiconductor light-emitting element includes: a sapphire substrate that transmits light toward the sealing member to send the transmitted light from a facing face facing the sealing member and forms a sub-wavelength grating for reducing reflection of light on the facing face in grid periods shorter than a wavelength of the light transmitted through the sapphire substrate, and a semiconductor layer that is formed on a rear face of the facing face in the sapphire substrate by crystal growth and emits light toward the sapphire substrate.

In addition, the sub-wavelength grating may include a plurality of convex portions protruding in the direction perpendicular to the facing face, the plurality of convex portions may be arranged in grating intervals shorter than half-wavelength of the light transmitted through the sapphire substrate, and the height of the convex portion may be longer than half-wavelength of the light transmitted through the sapphire substrate.

In addition, the semiconductor layer may emit ultraviolet rays toward the sapphire substrate, the sapphire substrate may transmit the ultraviolet rays emitted from the semiconductor layer to send the rays from the facing face to the sealing member, the light-emitting module may further include a phosphor layer for generating visible light by fluorescent effect according to the ultraviolet rays emitted from the semiconductor layer, in which the phosphor layer may be provided on the facing face of the sapphire substrate, the sealing member may be positioned to face the facing face of the sapphire substrate while putting the phosphor layer therebetween, the phosphor layer may have a refractive index smaller than that of the sapphire substrate, the grating intervals of the plurality of convex portions may be smaller than half-wavelength of the ultraviolet rays transmitted through the sapphire substrate, and the height of the convex portion may be longer than half-wavelength of the ultraviolet rays transmitted through the phosphor layer.

In addition, the semiconductor layer may emit blue light toward the sapphire substrate, the sapphire substrate may transmit the blue light emitted from the semiconductor layer to send the light from the facing face to the sealing member, the light-emitting module may further include a phosphor layer for generating yellow light by fluorescent effect according to the blue light emitted from the semiconductor layer, in which the phosphor layer may be provided on the facing face of the sapphire substrate, the sealing member may be positioned to face the facing face of the sapphire substrate while putting the phosphor layer therebetween, the phosphor layer may have a refractive index smaller than that of the sapphire substrate, the grating intervals of the plurality of convex portions may be smaller than half-wavelength of the blue light transmitted through the sapphire substrate, and the height of the convex portion may be longer than half-wavelength of the blue light transmitted through the phosphor layer.

In addition, a refractive index of the sealing member may be larger than that of air and not greater than 1.4, and the sealing member may have an outgoing face parallel to the facing face of the sapphire substrate and send the light incident from the sapphire substrate to the outside of the light-emitting module via the outgoing face.

In addition, the semiconductor layer may emit ultraviolet rays toward the sapphire substrate, the sapphire substrate may transmit the ultraviolet rays emitted from the semiconductor layer to send the rays from the facing face to the sealing member, the light-emitting module may further include a phosphor layer for generating visible light by fluorescent effect according to the ultraviolet rays emitted from the semiconductor layer, in which the phosphor layer may be provided on the facing face of the sapphire substrate, a refractive index of the phosphor layer may be smaller than that of the sapphire substrate and larger than that of the sealing member, and the sealing member may be formed of silicone resin or fluorine resin.

According to the second aspect of the present invention, there is provided a lamp that emits light. The lamp includes: a light-emitting module operable to emit light; and an optical member operable to irradiate light emitted from the light-emitting module to the outside of the lamp, in which the light-emitting module includes: a semiconductor light-emitting element operable to emit light; and a sealing member operable to seal the semiconductor light-emitting element with materials that transmit the light emitted from the light-emitting module, the semiconductor light-emitting element includes: a sapphire substrate that transmits light toward the sealing member to send the transmitted light from a facing face facing the sealing member and forms a sub-wavelength grating for reducing reflection of light on the facing face in grid periods shorter than a wavelength of the light transmitted through the sapphire substrate, and a semiconductor layer that is formed on a rear face of the facing face in the sapphire substrate by crystal growth and emits light toward the sapphire substrate.

In addition, the lamp may be a lamp used for a headlight of a vehicle, a refractive index of the sealing member may be larger than that of air and not greater than 1.4, the sealing member may have an outgoing face parallel to the facing face of the sapphire substrate and send the light incident from the sapphire substrate to the outside of the light-emitting module via the outgoing face, and the optical member may form at least a part of cut line that defines borders between bright and dark sides of a light distribution pattern of the headlight by projecting a shape of the facing face of the sapphire substrate.

The summary of the invention does not necessarily describe all necessary features of the present invention. The present invention may also be a sub-combination of the features described above.

BRIEF DESCRIPTION OF THE DRAWINGS

The above and other objects and features and advantages of the present invention will become more apparent from the following description of the presently preferred exemplary embodiments of the invention taken in conjunction with the accompanying drawings, in which.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
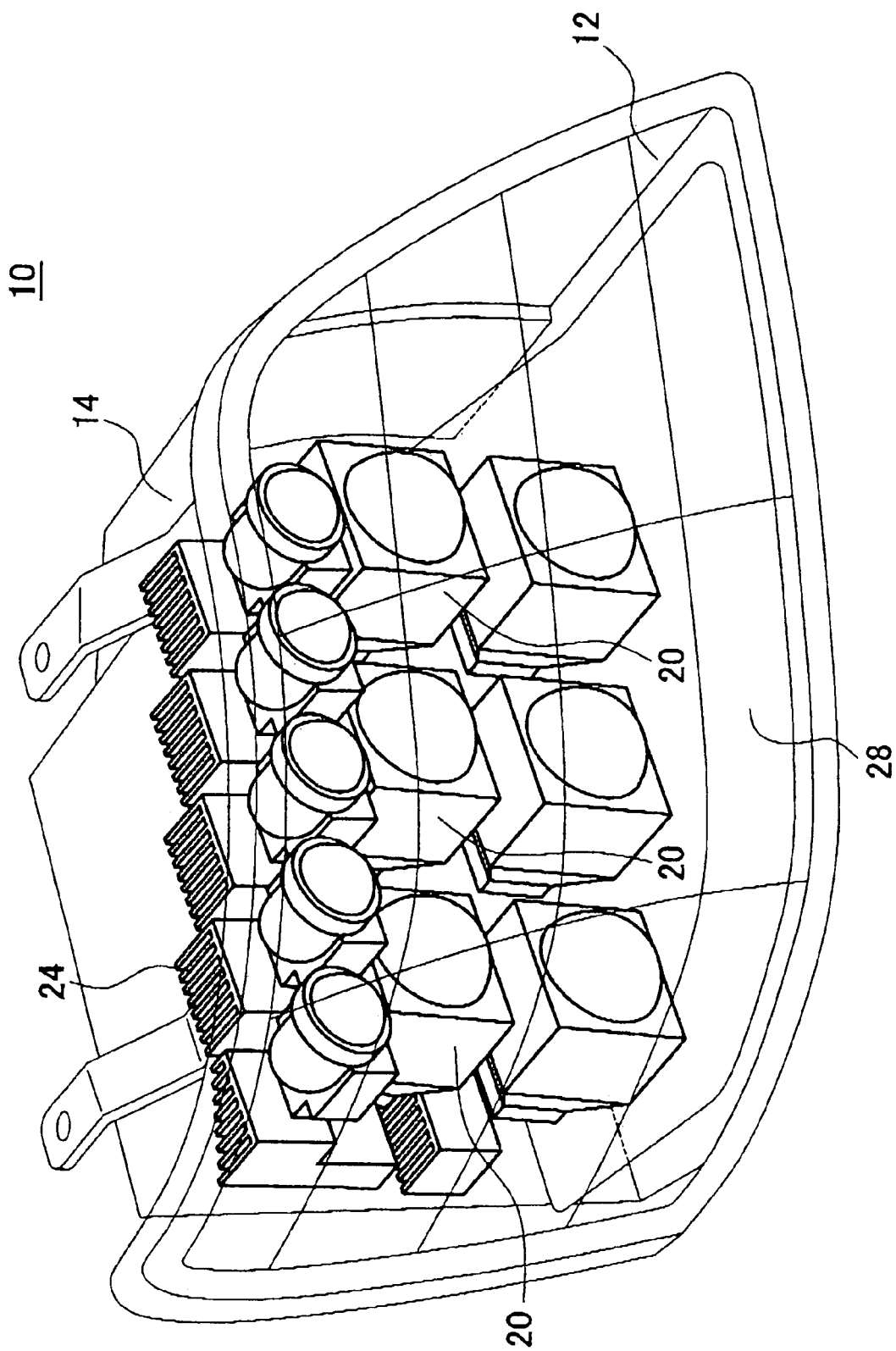
FIG. 1 is a perspective view showing a vehicular lamp according to an embodiment of the present invention.
Figure 2:
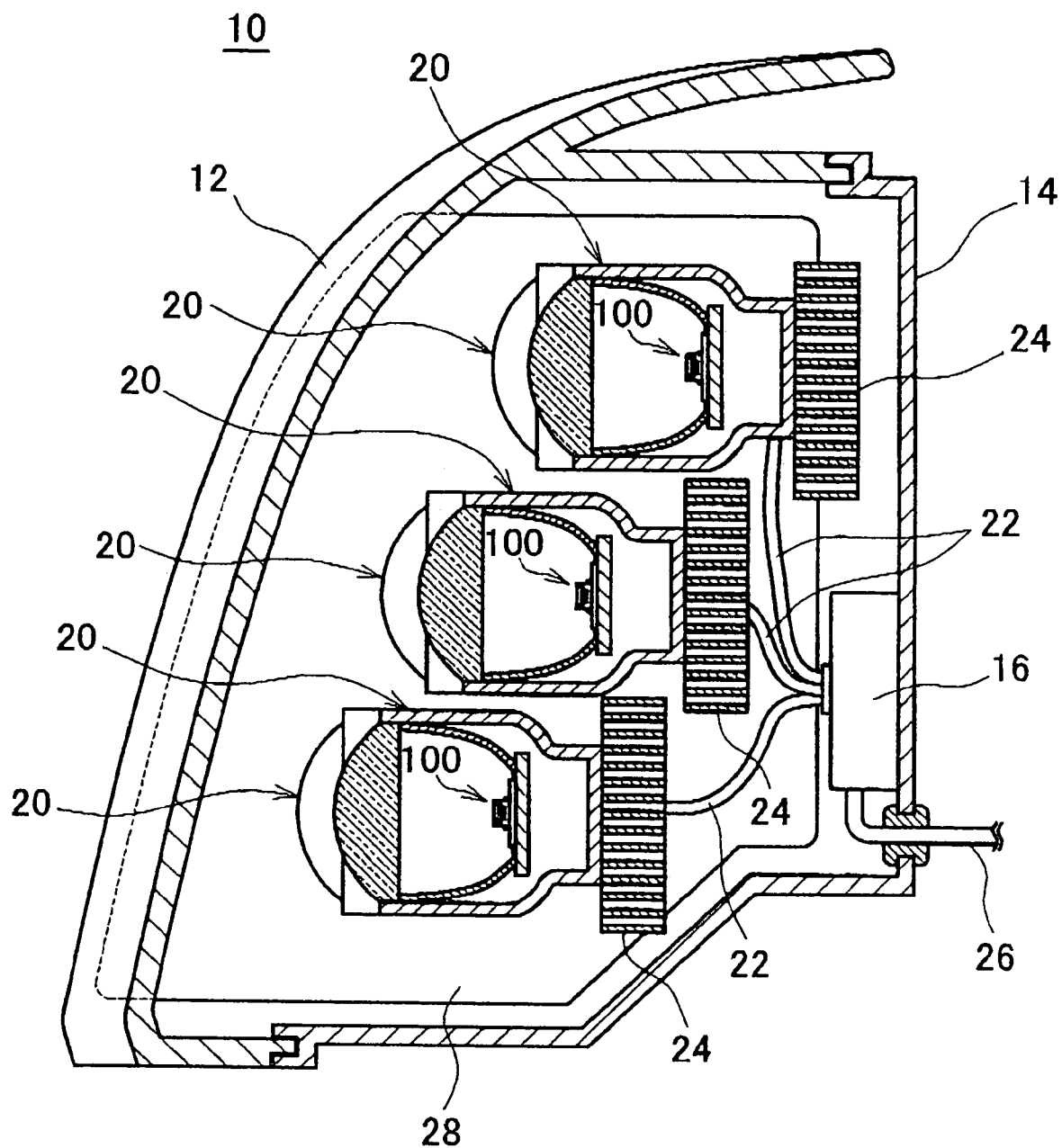
FIG. 2 is a horizontal sectional view of the vehicular lamp.

FIGS. 1 and 2 are views exemplary showing a configuration of a vehicular lamp 10 according to an embodiment of the present invention. FIG. 1 is a perspective view of the vehicular lamp 10. FIG. 2 is a horizontal sectional view of the vehicular lamp 10 by a horizontal plane crossing a light source unit 20 in the middle stage. The object of the present example is to form a light distribution pattern using efficiently light emitted from an LED module 100. The vehicular lamp 10 is, e.g., a headlight (a head lamp) used for a vehicle such as an automobile, and irradiates light ahead of the vehicle. The vehicular lamp 10 includes a plurality of light source units 20, a cover 12, a lamp body 14, a circuit unit 16, a plurality of heat dissipation members 24, an extension reflector 28, and cables 22 and 26.

Each of the plurality of light source units 20 has an LED module 100, and irradiates a predetermined light distribution pattern ahead of the vehicle based on light emitted from the LED module 100. The light source units 20 are supported by the lamp body 14, e.g., so as to be able to be tilted by an aiming mechanism for adjusting a direction of optical axis of the light source units 20. The light source units 20 may be supported by the lamp body 14 so that a direction of optical axis when the vehicular lamp 10 is mounted on a car body takes a downturn, e.g., by 0.3-0.6°.

In addition, the plurality of light source units 20 may have the same or similar light distribution characteristics as/to each other, and may have light distribution characteristics different from each other. In addition, in another example, one light source unit 20 may have the plurality of LED modules 100. The light source unit 20 may have, for example, a semiconductor laser in place of the LED module 100.

The cover 12 and the lamp body 14 form a light room of the vehicular lamp 10, and the light room accommodates the plurality of light source units 20 therein. The cover 12 and the lamp body 14 may seal and waterproof the light source units 20. The cover 12 is formed of materials for transmitting light emitted from the LED modules 100, e.g., in the shape of transparent glasses, and is provided in the front of the vehicle so as to cover the front of the plurality of light source units 20. The lamp body 14 is provided opposite to the cover 12 to put the plurality of light source units 20 therebetween, and thus the plurality of light source units 20 is covered from the rear. The lamp body 14 may integrally be formed with a vehicle body.

The circuit unit 16 is a module on which a lighting circuit such as a circuit for lighting the LED modules 100 is formed. The circuit unit 16 is electrically connected to the light source units 20 via the cable 22. In addition, the circuit unit 16 is electrically connected to the outside of the vehicular lamp 10 via the cable 26.

Each of the plurality of heat dissipation members 24 is a heat sink that is provided in contact with at least a part of the light source unit 20. The heat dissipation member 24 is formed of materials such as metal having higher thermal conductivity than that of air. The heat dissipation members 24 are movable with the light source units 20 in the range of moving the light source units 20 with respect to, e.g., a supporting point of an aiming mechanism. Additionally, the heat dissipation members 24 are provided at intervals sufficient to perform adjustment of the optical axes of the light source units 20 with respect to the lamp body 14. The plurality of heat dissipation members 24 may integrally be formed of one metallic member. In this case, heat dissipation can efficiently be done from the whole of the plurality of heat dissipation members 24.

The extension reflector 28 is a reflecting mirror that is formed of, e.g., thin metal plate from the lower part of the plurality of light source units 20 to the cover 12. The extension reflector 28 is formed to cover at least a part of the inside of the lamp body 14. Therefore, the extension reflector 28 hides the inside of the lamp body 14, thereby improving the appearance of the vehicular lamp 10.

In addition, at least apart of the extension reflector 28 is in contact with the light source unit 20 and/or the heat dissipation member 24. In this case, the extension reflector 28 acts as a thermal conduction member that conducts heat generated from the LED modules 100 to the cover 12. In this way, the extension reflector 28 radiates heat of the LED modules 100. Additionally, a part of the extension reflector 28 is fixed to the cover 12 or the lamp body 14. The extension reflector 28 may be formed in the shape of the frame in which the extension reflector 28 covers the upper part, the lower part, and the lateral part of the plurality of light source units 20.

According to this example, it is possible to miniaturize the light source unit 20 by using the LED module 100 as light source. In this way, degree of freedom of arrangement of, e.g., the light source units 20 is improved. Thus, it is possible to provide the vehicular lamp 10 having a variety of design.

Figure 3:
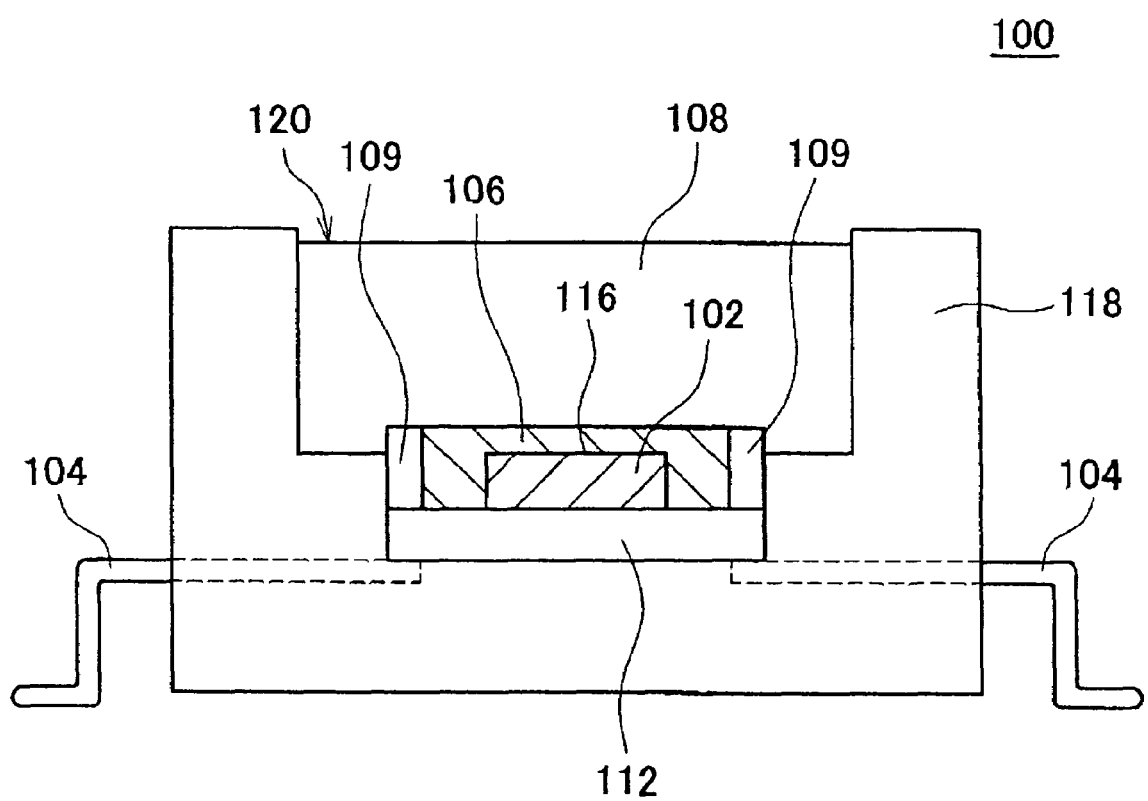
FIG. 3 is a view exemplary showing a configuration of an LED module.

FIG. 3 shows an example of a configuration of the LED module 100. The LED module 100 is an example of a light-emitting module for emitting light, and includes a substrate 112, a plurality of electrodes 104, a cavity 109, a holding section 118, a sealing member 108, a light-emitting diode element 102, and a phosphor layer 106.

The substrate 112 is a plate-like body that puts the light-emitting diode element 102 on its top face to fix it. In addition, the substrate 112 includes electric wiring for electrically connecting the light-emitting diode element 102 to the electrodes 104 in order to supply electric power received from the plurality of electrodes 104 to the light-emitting diode element 102. The plurality of electrodes 104 supplies electric power received from the outside of the LED module 100 to the light-emitting diode element 102 via the substrate 112. The cavity 109 is a void that is formed to surround the light-emitting diode element 102 on the substrate 112, and holds the phosphor layer 106 therein.

The holding section 118 holds the plurality of electrodes 104, the substrate 112, the cavity 109, and the sealing member 108. In addition, at least a part of the holding section 118 is formed of materials such as metal having higher thermal conductivity than that of air, and thus transmits heat generated from the light-emitting diode element 102 to the outside of the LED module 100 via, e.g., the substrate 112.

The light-emitting diode element 102 is an example of a semiconductor light-emitting element for emitting light, and emits ultraviolet rays in accordance with electric power received from the outside of the LED module 100 via the electrode 104 and the substrate 112. In this example, the light-emitting diode element 102 emits light by using the substantially whole part of a light-emitting face 116 that is a surface facing the sealing member 108 as an emitting region. In this example, the light-emitting face 116 is a rectangle surrounded by straight line-shaped four sides. Additionally, in another example, the light-emitting diode element 102 may emit, e.g., blue light in place of ultraviolet rays. The LED module 100 may use, e.g., a laser diode element as a semiconductor light-emitting element.

The phosphor layer 106 is provided to cover the surface of the light-emitting diode element 102 by being filled in the cavity 109, and emits red light, green light, and blue light in accordance with ultraviolet rays emitted from the light-emitting diode element 102. In this way, the phosphor layer 106 emits white light in accordance with ultraviolet rays. In addition, the LED module 100 thereby emits white light. When the light-emitting diode element 102 emits blue light, the phosphor layer 106 may also emit light of yellow that is complementary color of blue in accordance with blue light emitted from the light-emitting diode element 102. In this case, the LED module 100 emits white light based on blue light and yellow light emitted from the light-emitting diode element 102 and the phosphor layer 106. The phosphor layer 106 may be provided in the inside of the sealing member 108.

The sealing member 108 is a mold for sealing the light-emitting diode element 102. In this example, the sealing member 108 seals the light-emitting diode element 102 and the phosphor layer 106 with materials that transmit white light. In this case, the sealing member 108 is positioned to face the light-emitting diode element 102 while putting the phosphor layer 106 therebetween. In addition, this white light is an example of light emitted from the LED module 100. The sealing member 108 may be formed of, e.g., silicone resin or fluorine resin. The sealing member 108 has larger refractive index than that of air of, e.g., about 1.3 to 1.6. Furthermore, it is preferable that the sealing member 108 has a refractive index no more than 1.4. In this case, it is possible to efficiently send light emitted from the light-emitting diode element 102 to the outside of the LED module 100 by reducing total reflection occurring on an interface between the sealing member 108 and air. Therefore, according to the present example, it is possible to efficiently utilize light emitted from the LED module 100.

In addition, in this example, the sealing member 108 has an outgoing face 120, and is in contact with air at the outgoing face 120. The outgoing face 120 is formed in the shape of a plane parallel to the light-emitting face 116 of the light-emitting diode element 102. The sealing member 108 sends light incident from the interface facing the light-emitting diode element 102 to the outside via the outgoing face 120. In this way, the sealing member 108 transmits red light, green light, and blue light generated from the phosphor layer 106 in order to send light to an air medium via the outgoing face 120.

Here, when the outgoing face 120 is, e.g., the shape of a spherical surface, the sealing member 108 acts as a convex lens. In this case, an optical design of the light source unit 20 (see FIG. 1) should consider the function of the convex lens. For that purpose, for example, the optical design can be complicated in some cases. In addition, if it is attempted to form the convex lens with high precision in order to form a light distribution pattern with high precision, the cost of the LED module 100 can greatly rise in some cases.

However, in this example, the outgoing face 120 is formed in the shape of a plane. For that purpose, according to the present example, it is possible to simply realize an optical design of the light source unit 20 without considering the lens function of the sealing member 108. In addition, the outgoing face 120 having a planar shape can cheaply be formed with high accuracy. Therefore, according to the present example, the LED module 100 can be offered at low cost.

Figure 4:
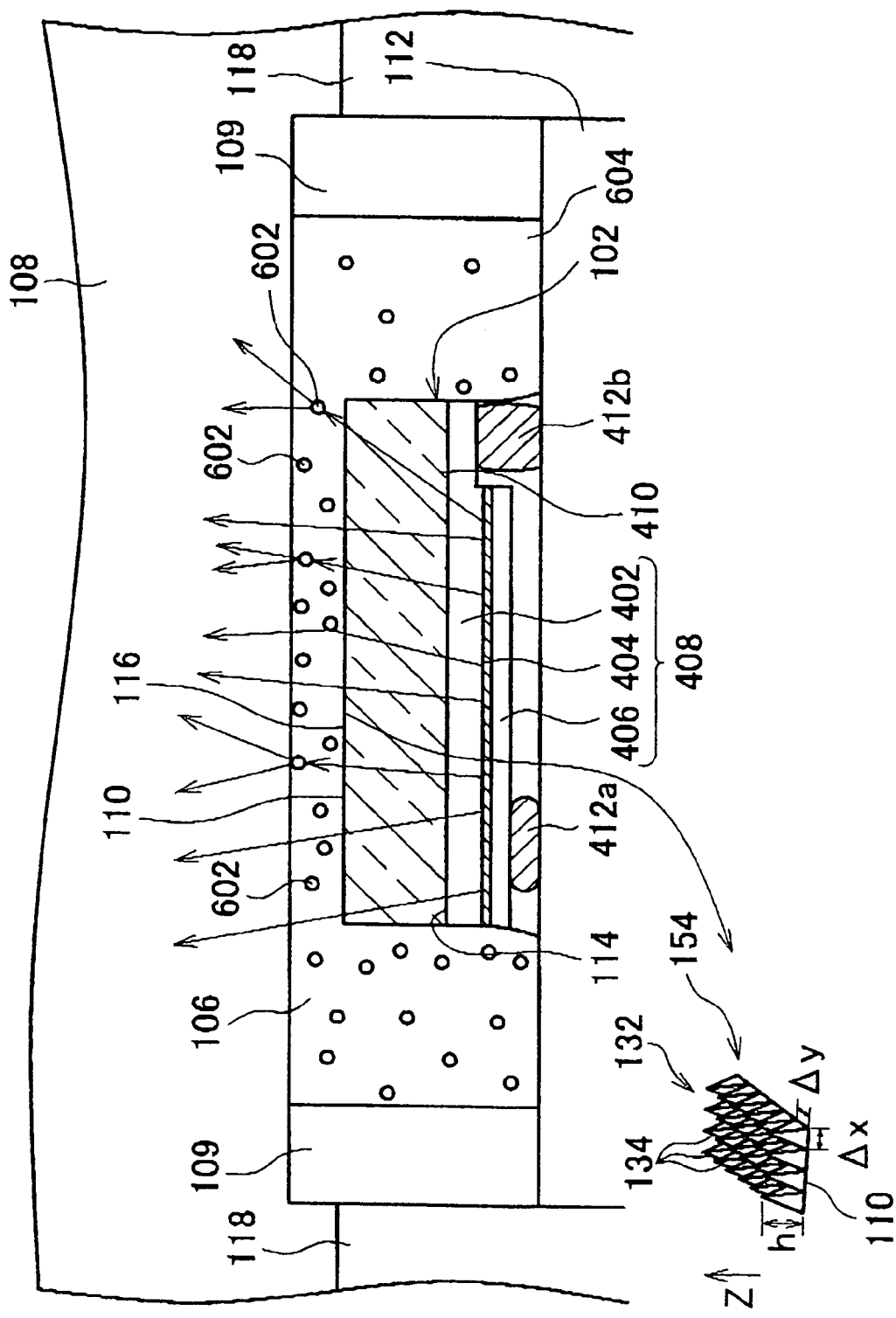
FIG. 4 is a view exemplary showing a detailed configuration of a light-emitting diode element and a phosphor layer.

FIG. 4 is a view exemplary showing a detailed configuration of the light-emitting diode element 102 and the phosphor layer 106 along with the substrate 112, the cavity 109, the holding section 118, and the sealing member 108. In this example, the light-emitting diode element 102 includes a plurality of electrodes 412a and 412b, a sapphire substrate 410, and a semiconductor layer 408, and is flip-chip mounted on the substrate 112 so that the sapphire substrate 410 and the substrate 112 are positioned to face each other while putting the semiconductor layer 408 therebetween. The electrodes 412a and 412b are, e.g., solder bumps, and electrically connect the semiconductor layer 408 and the substrate 112.

The sapphire substrate 410 has a refractive index of about 1.8 (e.g., 1.75 to 1.85), and transmits light emitted from the semiconductor layer 408 toward the sealing member 108. Then, the sapphire substrate 410 sends the transmitted light from a facing face 110 that faces the sealing member 108 to the sealing member 108. In this way, the light-emitting diode element 102 emits light using the facing face 110 as the light-emitting face 116. In this case, the sealing member 108 sends light, which is incident from the sapphire substrate 410, from the outgoing face 120 (see FIG. 3) parallel to the facing face 110 to the outside of the LED module 100 (see FIG. 3).

In addition, in this example, a sub-wavelength grating (SWG) 132 as shown in an enlarged view 154 is formed on the facing face 110 of the sapphire substrate 410. The sub-wavelength grating 132 is formed with shorter grid period than a wavelength of light transmitted through the sapphire substrate 410, and thus reduces the reflection of light on the facing face 110. Here, the enlarged view 154 shows the sub-wavelength grating 132 seen from obliquely upward direction.

The semiconductor layer 408 has a refractive index of, e.g., about 2.2 to 2.5, and emits light toward the sapphire substrate 410. The semiconductor layer 408 may have a refractive index of, e.g., about 2 to 4. The semiconductor layer 408 is formed by crystal growth on a rear face of the facing face 110 in the sapphire substrate 410.

In this example, the semiconductor layer 408 includes an N type GaN layer 402, an InGaN layer 404, and a P type GaN layer 406. The N type GaN layer 402, the InGaN layer 404 and the P type GaN layer 406 are formed by a sequential lamination on the rear face 114 of the sapphire substrate 410. The semiconductor layer 408 may have further another layer between these layers.

The N type GaN layer 402 is formed by a lamination on the rear face 114 of the sapphire substrate 410, and is connected to the substrate 112 by the electrode 412b. The N type GaN layer 402 may be formed on the sapphire substrate 410 after putting an $Al_xIn_yGa_{1-x-y}N$ ($0 \leq x \leq 1$, $0 \leq y \leq 1$, $x+y \leq 1$) buffer layer therebetween.

The InGaN layer 404 is an active layer acting as the light-emitting layer, and is formed by a lamination on the N type GaN layer 402. In this case, the InGaN layer 404 is formed by doping an N type or P type dopant, preferably, Si. The InGaN layer 404 may be formed on the N type GaN layer 402 while putting, e.g., an N type AlGaN layer therebetween.

The P type GaN layer 406 is formed by a lamination on the InGaN layer 404, and is connected to the substrate 112 by the electrode 412a. The P type GaN layer 406 may be formed on the InGaN layer 404 while putting, e.g., a P type AlGaN layer therebetween.

In this way, the semiconductor layer 408 emits ultraviolet rays having a wavelength of, e.g., about 360 to 380 nm toward the sapphire substrate 410 in accordance with electric power received through the electrodes 412a and 412b and the substrate 112.

In addition, the semiconductor layer 408 may have a well-known layer structure other than the above. For example, the semiconductor layer 408 may be formed of a GaN series semiconductor other than the above. Here, the GaN series semiconductor is, e.g., $Al_xIn_yGa_{1-x-y}N$ ($0 \leq x \leq 1$, $0 \leq y \leq 1$, $x+y \leq 1$). The GaN series semiconductor may be used as an N type layer with an additive-free layer that does not dope impurities, or may be used as a GaN series semiconductor layer of each conductivity type by doping each dopant of an acceptor and a donor. In this case, Si, Ge, Sn, or the like, preferably Si may be used as an N type impurity. Additionally, Be, Zn, Mn, Cr, Mg, Ca, or the like, preferably Mg, to which it is not particularly limited, may be used as an P type impurity. In another example, the semiconductor layer 408 may also emit blue light toward the sapphire substrate 410.

The phosphor layer 106 emits visible light by fluorescent effect according to ultraviolet rays generated from the semiconductor layer 408. In this example, the phosphor layer 106 has phosphor particles 602 and a binder 604. In this example, the phosphor particles 602 have a refractive index of, e.g., about 2 to 3. The binder 604 has a refractive index of, e.g., about 1.3 to 1.6.

In addition, the phosphor particles 602 generate visible light in accordance with ultraviolet rays. The binder 604 is formed of, e.g., silicone resin, fluorine resin, or the like, and holds the phosphor particles 602 on the facing face 110 of the sapphire substrate 410 by accommodating the phosphor particles 602 therein. In this way, the phosphor layer 106 is provided on the facing face 110 of the sapphire substrate 410. In this case, the sealing member 108 is positioned to face the facing face 110 of the sapphire substrate 410 while putting the phosphor layer 106 therebetween.

For that purpose, it is preferable that a refractive index of the phosphor layer 106 is smaller than that of the sapphire substrate 410 and larger than that of the sealing member 108. In this case, the ultraviolet rays generated from the semiconductor layer 408 can be incident on the phosphor layer 106 with high efficiency, and the light generated from the phosphor layer 106 can be incident on the sealing member 108 with high efficiency. In addition, a refractive index of the phosphor layer 106 is a refractive index on, e.g., the interface of the phosphor layer 106. The refractive index on the interface of the phosphor layer 106 is not affected by a refractive index of the internal phosphor particles. Thus, the refractive index on the interface of the phosphor layer 106 is the substantially same as a refractive index of the binder in the phosphor layer 106, and is, e.g., about 1.3 to 1.6.

In addition, in this example, the phosphor layer 106 has the plural types of phosphor particles 602 that emit light of colors different from each other. The phosphor particles 602 of each type respectively emit red light, green light, and blue light in accordance with ultraviolet rays. In this way, the phosphor layer 106 emits white light in accordance with ultraviolet rays. In addition, in this case, since the phosphor layer 106 emits light of three primary colors, it is possible to generate white light having high color rendering properties.

Here, when the semiconductor layer 408 generates blue light, the phosphor layer 106 may emit yellow light by fluorescent effect according to the blue light generated from the semiconductor layer 408. In this case, the light-emitting diode element 102 and the phosphor layer 106 also emit white light by generating blue light and yellow light that are a complementary color relationship each other. In addition, in this case, the sapphire substrate 410 transmits the blue light emitted from the semiconductor layer 408 to send this light from the facing side 110 to the sealing member 108.

Hereinafter, the sub-wavelength grating 132 will be explained in more detail. In this example, the sub-wavelength grating 132 has a plurality of convex portions 134 protruding in a direction perpendicular to the facing face 110. In this case, diffracted waves are not generated, and thus the sub-wavelength grating 132 is equivalent to a medium having a middle effective refractive index between the inside and the outside of the sapphire substrate 410 with respect to light that is incident from the inside of the sapphire substrate 410 to the facing face 110.

Here, the sealing member 108 preferably has a refractive index similar to that of air, e.g., less than or equal to about 1.4 in order to efficiently send light from the sealing member 108 to an air medium. However, in this case, a difference of the refractive index between the inside and the outside of the sapphire substrate 410 on the facing face 110 can become large in some cases. For that purpose, in this case, when it is attempted to send light from the inside of the sapphire substrate 410, e.g., without the sub-wavelength grating 132, total reflection of the light can occur on the facing face 110 due to the discontinuous change of a refractive index. Therefore, it is not possible to efficiently send light from the sapphire substrate 410 in some cases.

However, in this example, the sub-wavelength grating 132 has a middle effective refractive index between the inside and the outside of the sapphire substrate 410. For that purpose, according to the present example, it is possible to reduce the reflection of light on the facing face 110. In this way, it is also possible to efficiently send light from the sapphire substrate 410. Therefore, according to the present example, it is possible to provide the LED module 100 having high light-emitting efficiency.

In addition, when the sub-wavelength grating 132 is not formed on the facing side 110, in order to efficiently send light emitted from the light-emitting diode element 102 to the sealing member 108, it is required that a refractive index of the sealing member 108 is as high as that of the light-emitting diode element 102 in some cases. However, in this case, in order to adequately send light from the sealing member 108 to an air medium, it is required that the outgoing face 120 (see FIG. 3) is formed, e.g., in the shape of a spherical surface in some cases. In addition, resin that is suitable for the sealing member 108 and has a refractive index as high as that of the light-emitting diode element 102 has low tolerance to ultraviolet rays in some cases.

However, according to this example, the sub-wavelength grating 132 is formed on the facing face 110. Thus, the sealing member 108 can be formed of materials having a refractive index of, e.g., about 1 to 1.4. In this case, since a difference of a refractive index between the sealing member 108 and air is small, the outgoing face 120 can be formed in the shape of plane. For that purpose, according to this example, it is possible to form the outgoing face 120 with high accuracy and at low cost. In addition, according to this example, since a refractive index of the sealing member 108 can be defined as about 1 to 1.4, the sealing member 108 can be formed of materials having high tolerance to ultraviolet rays, such as silicone resin or fluorine resin.

In addition, the plurality of convex portions 134 is formed by etching the facing face 110 of the sapphire substrate 410. To perform this etching, for example, a resist pattern corresponding to the plurality of convex portions 134 is used as an etching mask. In addition, this resist pattern is formed by a pattern description, e.g., according to an electron beam lithography method.

Here, in another example, it is also conceivable that the sub-wavelength grating 132 is formed, e.g., on the surface of the semiconductor layer 408. However, since the surface of the semiconductor layer 408 forms the electrodes 412 thereon, the surface of the semiconductor layer 408 has low flatness compared with the facing face 110 of the sapphire substrate 410 in some cases. In this case, for example, since a part on which the electrodes 412 are formed is uneven, it is difficult to form a uniform resist film with high precision in some cases. In addition, in this case, even if it is assumed that an electron beam lithography method is used, it is difficult to form a resist pattern with high precision in some cases.

However, in this example, the sub-wavelength grating 132 is formed on the facing side 110 of the sapphire substrate 410 having high flatness. For that purpose, according to this example, the sub-wavelength grating 132 can be formed with high precision. In this way, it is possible to adequately form the LED module 100 having high light-emitting efficiency.

Figure 5:
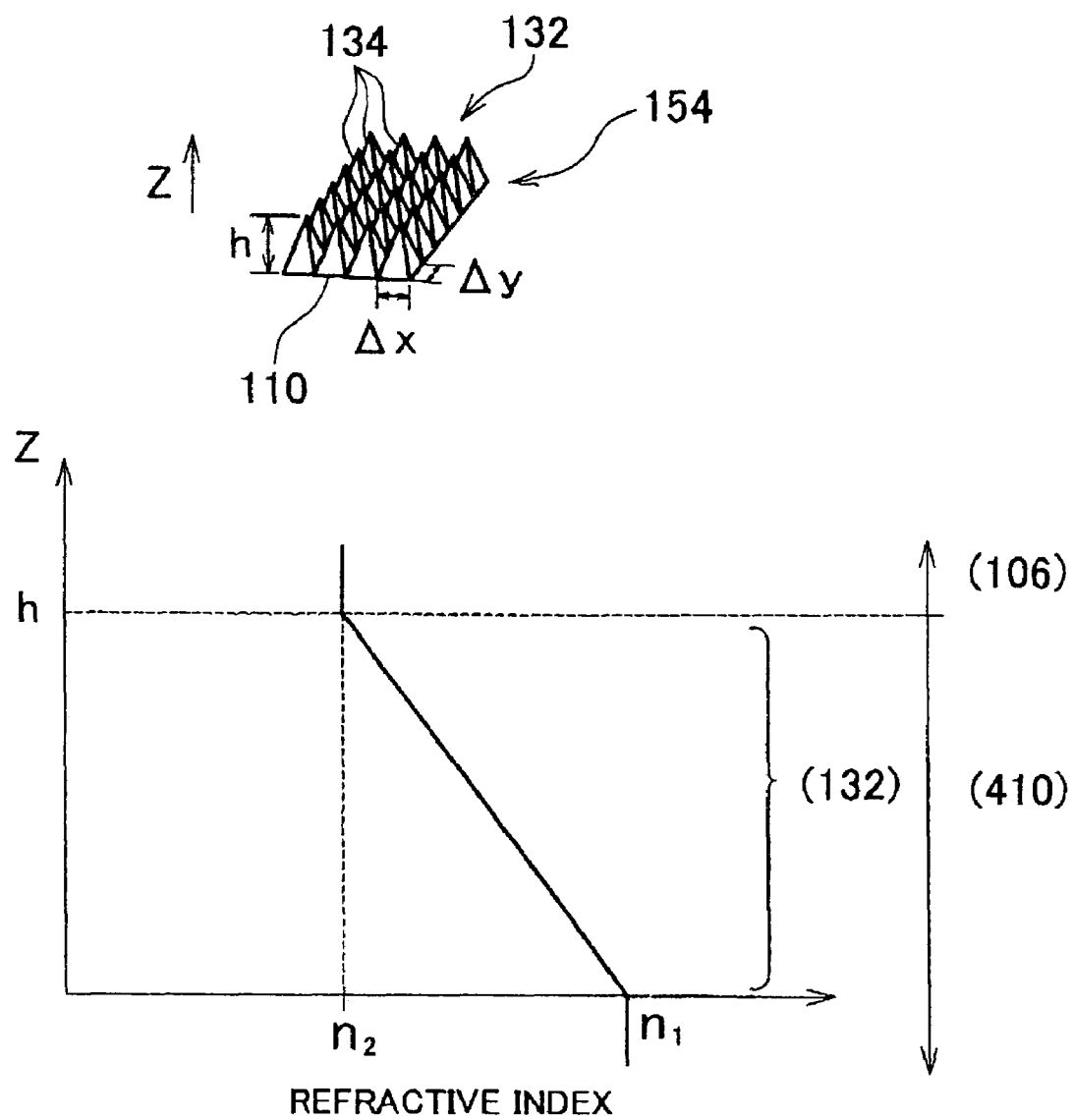
FIG. 5 is a view exemplary explaining a function of a sub-wavelength grating.

FIG. 5 is a view exemplary explaining a function of the sub-wavelength grating 132. In this example, a refractive index of the sapphire substrate 410 is $n_1$. In addition, a refractive index of the phosphor layer 106 is $n_2$. Furthermore, each of the convex portions 134 in the sub-wavelength grating 132 has the shape of a quadrangular pyramid and a cross-section area that is gradually reduced in the direction of height (z-axis) perpendicular to the facing face 110.

Here, an effective refractive index of the sub-wavelength grating 132 is varied in accordance with volume occupancy rate of a medium of the sapphire substrate 410 and the phosphor layer 106. For that purpose, in this example, an effective refractive index of the sub-wavelength grating 132 is gradually varied from the refractive index $n_1$ of the sapphire substrate 410 to the refractive index $n_2$ of the phosphor layer 106 in accordance with a distance h from a bottom face of the convex portion 134. In this way, a difference between a refractive index of the inside and a refractive index of the outside of the sapphire substrate 410 on the facing face 110 can smoothly be matched. Therefore, according to the present example, reflection from the facing face 110 can be reduced.

Here, it is preferable that the plurality of convex portions 134 is arranged at grating intervals $\Delta x$, $\Delta y$ shorter than half-wavelength of light to be transmitted through the sapphire substrate 410. For example, the grating intervals of the plurality of convex portions 134 may be shorter than half-wavelength of ultraviolet rays within the sapphire substrate 410. It is preferable that the height h of the convex portion 134 is longer than half-wavelength of light to be transmitted through the sapphire substrate 410. In this case, the height h of the convex portion 134 may be longer than half-wavelength of ultraviolet rays within the phosphor lays 106. In this case, reflection from the facing face 110 can further be reduced adequately.

Here, when the light-emitting diode element 102 emits blue light, the grating intervals $\Delta x$, $\Delta y$ of the plurality of convex portions 134 may be shorter than half-wavelength of blue light within the sapphire substrate 410. In addition, the height h of the convex portion 134 may be longer than half-wavelength of blue light within the phosphor layer 106. Additionally, in another example, the convex portion 134 may be, e.g., a conical shape or a pyramidal shape having many angles. It is preferable that the convex portions 134 are formed in a tapered shape of which a cross-section area is gradually reduced in the direction of height. In addition, it is preferable that an aspect ratio of the convex portion 134 is one or more.

Figure 6:
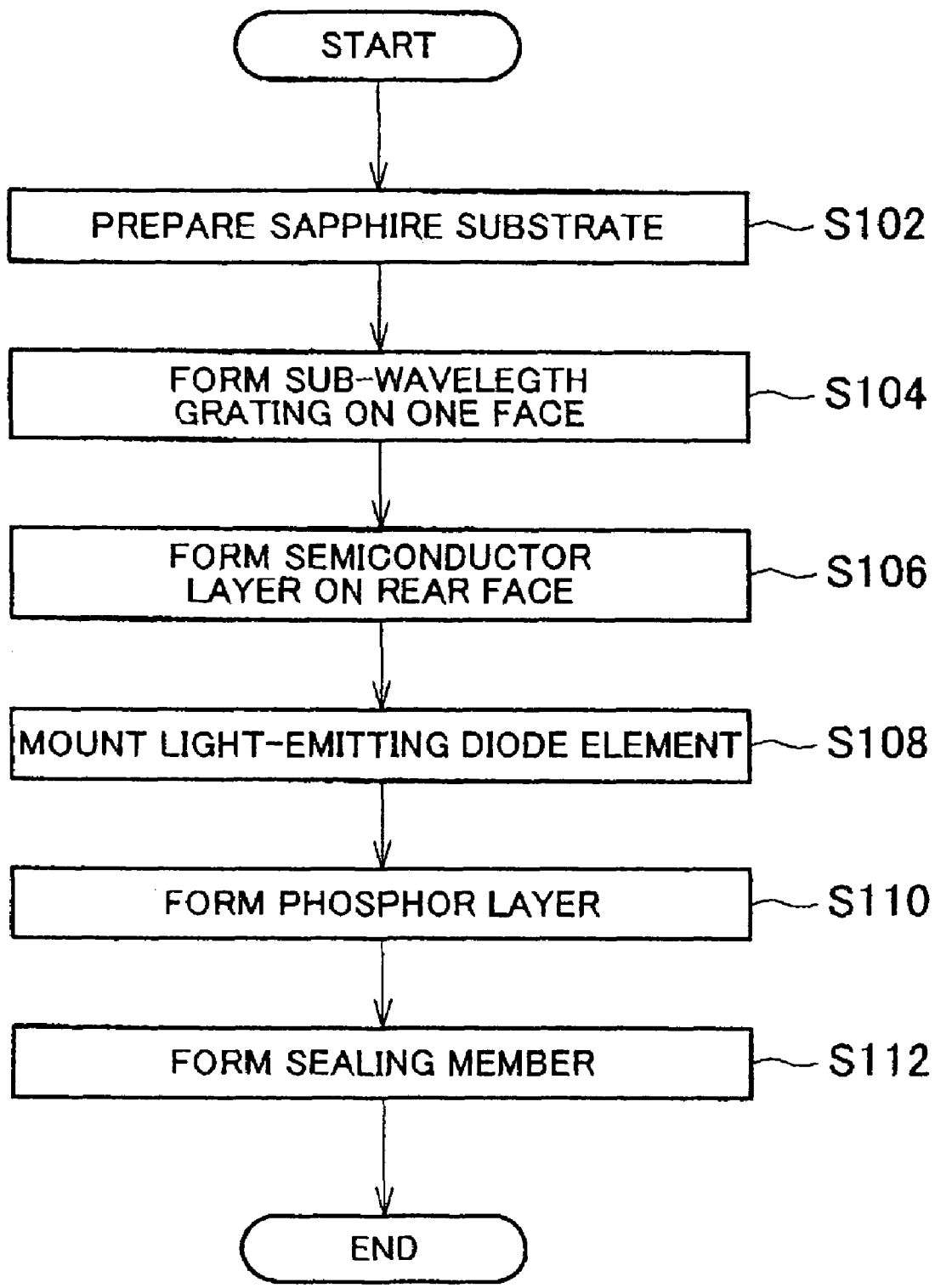
FIG. 6 is a flowchart exemplary showing a method for manufacturing the LED module.

FIG. 6 is a flowchart exemplary showing a method for manufacturing the LED module 100. In this manufacturing method, the sapphire substrate 410 is first prepared (S102). Then, the sub-wavelength grating 132 is formed on one face of the sapphire substrate 410 (S104). In this example, the sub-wavelength grating 132 is formed on a face that should act as the facing face 110 of the sapphire substrate 410.

Then, the semiconductor layer 408 is formed on the rear face of the sapphire substrate 410, e.g., by an epitaxial crystal growth method (S106). In this way, the light-emitting diode element 102 is formed. In addition, the rear face of the sapphire substrate 410 is a rear face of a face that should act as the facing face 110.

Next, the light-emitting diode element 102 is mounted on, e.g., the substrate 112 held in the holding section 118 (S108), and the phosphor layer 106 is formed by filling, e.g., the binder 604 containing the phosphor particles 602 in the cavity 109 (S110).

Next, the sealing member 108 is formed to seal the light-emitting diode element 102 and the phosphor layer 106 (S112), and then the manufacturing method of this example terminates the flowchart. According to this example, it is possible to adequately form the LED module 100.

Here, since the process for forming the semiconductor layer 408 in the S106 uses an epitaxial crystal growth method, this process requires much necessary time and high precision compared with other processes. For that purpose, if the formation of the sub-wavelength grating 132 is performed, e.g., after forming the semiconductor layer 408, a manufacturing cost of the LED module 100 can greatly rise in some cases, e.g., when the formation yield of the sub-wavelength grating 132 falls.

However, in this example, since the sub-wavelength grating 132 is formed on the sapphire substrate 410, the sub-wavelength grating 132 is formed earlier than the semiconductor layer 408. In this case, for example, when the formation of the sub-wavelength grating 132 has failed, the following processes can be omitted by disusing this sapphire substrate 410. Therefore, according to this example, it is possible to reduce the production cost of the LED module 100.

Figure 7:
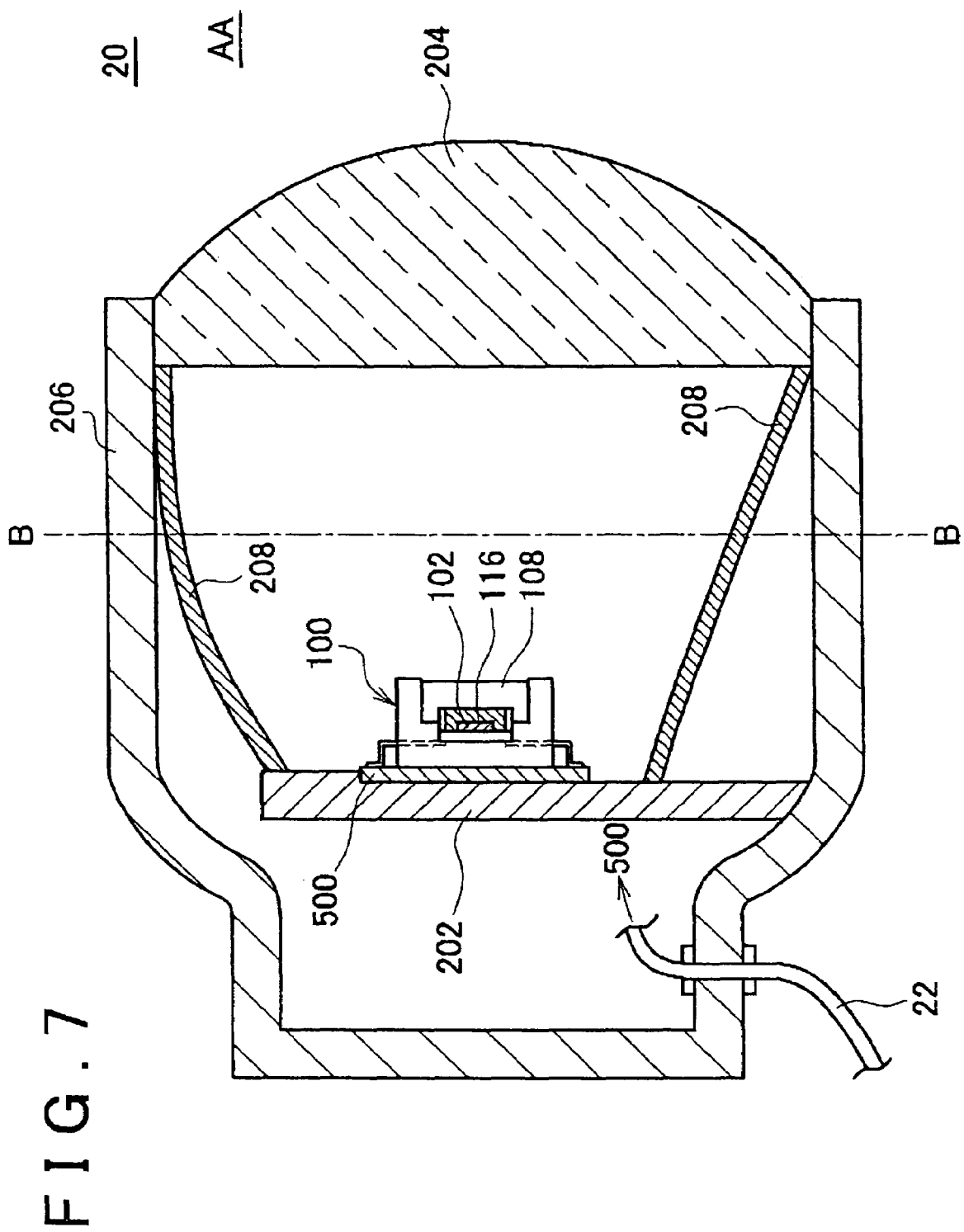
FIG. 7 is a vertical sectional view taken on line A-A of a light source unit.
Figure 8:
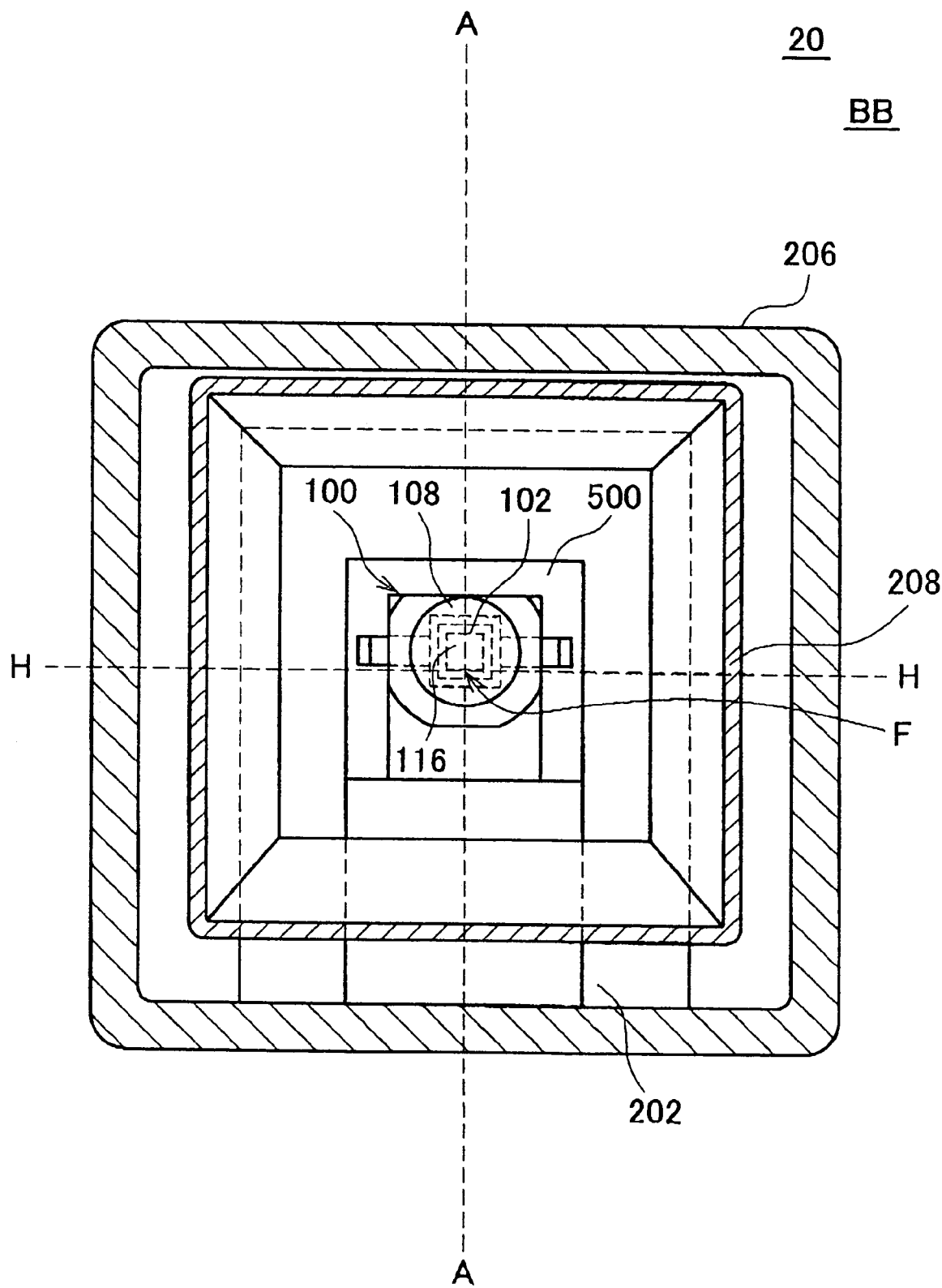
FIG. 8 is a vertical sectional view taken on line B-B of the light source unit.

FIGS. 7 and 8 are views exemplary showing a configuration of the light source unit 20. FIG. 7 is a vertical sectional view taken on line A-A of the light source unit 20. FIG. 8 is a vertical sectional view taken on line B-B of the light source unit 20. The light source unit 20 is a light source unit of a direct projection type that irradiates light emitted from the LED module 100 ahead of the vehicle, and includes the LED module 100, a substrate 500, a fixing member 202, a lens 204, an extension 208, and a housing 206.

The LED module 100 is fixed on the substrate 500 so that one side on the light-emitting face 116 of the light-emitting diode element 102 and an optical axis of the lens 204 are orthogonal each other. In addition, the light-emitting diode element 102 emits light from the light-emitting face 116 based on electric power received from the outside of the light source unit 20 via the cable 22 and the substrate 500. In this example, the light-emitting face 116 of the light-emitting diode element 102 is the facing face 110 of the sapphire substrate 410 (see FIG. 4).

The substrate 500 electrically connects the LED module 100 and the cable 22, e.g., by printed wiring formed on its surface or in its inside. In this example, the substrate 500 is a plate-like body that puts the LED module 100 thereon to fix it, and fixes the LED module 100 at a predetermined reference position. At least a part of the substrate 500 is formed of materials such as metal having higher thermal conductivity than that of air. In addition, at least a part of the substrate 500 is in contact with the fixing member 202. In this way, the substrate 500 transmits heat generated from the LED module 100 to the fixing member 202.

The fixing member 202 is a plate-like body having a surface that faces toward, e.g., the front of the vehicle. The fixing member 202 is provided at a position capable of knowing a relative position to the lens 204. In addition, the fixing member 202 fixes the substrate 500 thereon so as to face the LED module 100 while putting the substrate 500 therebetween. In this way, the fixing member 202 fixes the LED module 100 to face toward the front of the vehicle, and thus the LED module emits light ahead of the vehicle.

In addition, the fixing member 202 is formed of materials such as metal having higher thermal conductivity than that of air. The fixing member 202 also comes in contact with the housing 206 at its one end. In this way, the fixing member 202 transmits heat generated from the LED module 100 to the housing 206 in order to radiate heat in the LED module 100. Therefore, it is possible to prevent a light-emitting amount of the LED module 100 from falling by heat.

The extension 208 is formed of, e.g., thin metal plate from the vicinity of the LED module 100 to the vicinity of an edge of the lens 204. In this way, the extension 208 covers a clearance between the inside of the housing 206 and the LED module 100 so as to improve an appearance of the vehicular lamp 10 (see FIG. 1). The extension 208 may reflect light emitted from the LED module 100.

The housing 206 is a casing that accommodates the LED module 100, the substrate 500, the fixing member 202, and the extension 208. In addition, the housing 206 has an opening section in its front face, and holds the lens 204 in the opening section. The housing 206 may further transmit heat received from the LED module 100 through the substrate 500 and the fixing member 202 to the heat dissipation member 24 (see FIG. 1) and/or the extension reflector 28 (see FIG. 1). Therefore, it is possible to adequately radiate heat in the LED module 100.

The lens 204 is an example of an optical member used for the vehicular lamp 10, and irradiates light emitted from the LED module 100 to the outside of the vehicular lamp 10. In this example, the lens 204 forms at least a part of the light distribution pattern by projecting a shape of the light-emitting face 116 of the light-emitting diode element 102 on the front of the vehicle. In addition, the lens 204 has a focal point F, which is an example of the optical center, on one side of the light-emitting face 116. In this case, the lens 204 forms at least a part of cut line that defines borders between bright and dark sides of the light distribution pattern, e.g., based on a shape of this straight line-shaped border. According to this example, it is possible to adequately form a light distribution pattern.

In addition, in the LED module 100 of this example, the outgoing face 120 of the sealing member 108 is formed in the shape of plane. However, in another example, if the outgoing face 120 is, e.g., the shape of a spherical surface, the light-emitting face 116 seen from the lens 204 has an image magnified by the lens-shaped sealing member 108. In this case, it can be required that the sealing member 108 closer to the light-emitting diode element 102 than the lens 204 is formed with higher precision than, e.g., that of the lens 204 in order to form a light distribution pattern with high precision, in some cases. In this way, the production cost of the LED module 100 can rise in some cases. In addition, since a position adjustment of the LED module 100 should be performed in consideration of the size of the magnified image of the light-emitting diode element 102, the position adjustment cannot be performed with high precision in some cases.

However, according to this example, since the sub-wavelength grating 132 is formed on the facing face 110 of the sapphire substrate 410 (see FIG. 4), the sealing member 108 having the plane-shaped outgoing face 120 can be used. Therefore, according to this example, the vehicular lamp 10 having a light distribution pattern formed with high precision can be offered at low cost. In addition, the position adjustment of the LED module 100 is performed while observing the light-emitting diode element 102 of the real size that is not magnified. Therefore, the position of the LED module 100 in relation to the lens 204 can simply be adjusted with high accuracy.

Figure 9:
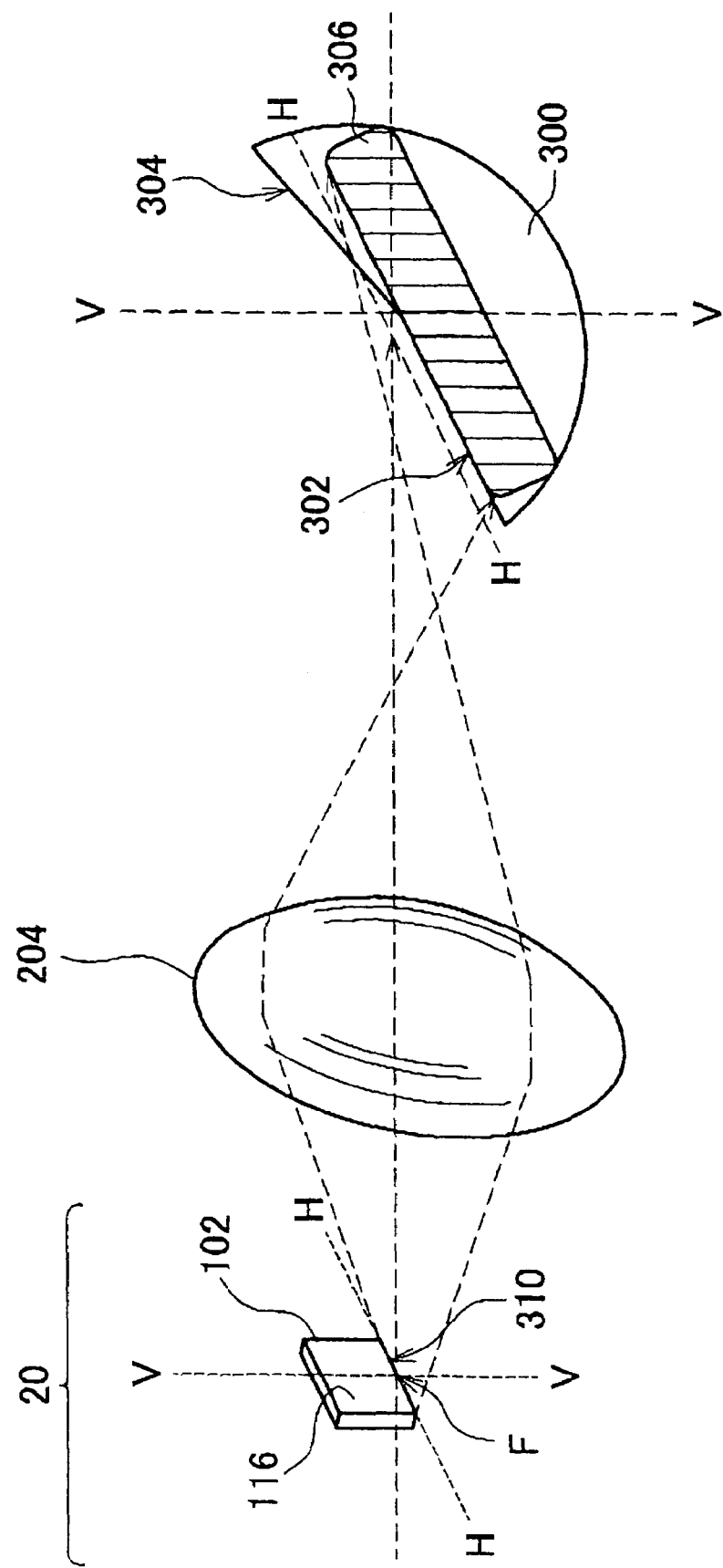
FIG. 9 is a conceptual view exemplary showing a light distribution pattern.

FIG. 9 is a conceptual view exemplary showing a light distribution pattern 300 formed by the vehicular lamp 10 (see FIG. 1). The light distribution pattern 300 is a low-beam light distribution pattern formed on a virtual vertical screen disposed on the position of 25 m in the front of the vehicular lamp 10. In this example, the vehicular lamp 10 forms the light distribution pattern 300 having a level cut line 302 that defines a border between bright and dark sides in the generally horizontal direction and an oblique cut line 304 that defines a border between bright and dark sides in the predetermined oblique direction forming an angle of about 15° to the horizontal direction.

In this example, the vehicular lamp 10 includes the plurality of light source units 20 having light distribution characteristics different from each other, and forms the light distribution pattern 300 based on light emitted from each of the light source units 20. In this case, each of the light source units 20 forms some area of the light distribution pattern 300. For example, the light source unit 20 explained by FIGS. 7 and 8 forms some area 306 of the light distribution pattern 300.

Hereinafter, the light distribution characteristics of the light source unit 20 explained by FIGS. 7 and 8 will be described in more detail. In this example, the lens 204 of the light source unit 20 projects a shape of the light-emitting face 116 of the light-emitting diode element 102 ahead of the vehicle to form the area 306 by irradiating light emitted from the light-emitting diode element 102 forward. The lens 204 may magnify and project a shape of the light-emitting face 116 in the horizontal direction.

Here, in this example, the lens 204 has a focal point F on one side 310 of the light-emitting face 116. The side 310 is a lower side extended in the horizontal direction on the light-emitting face 116. In addition, the lens 204 crosses optical axes of the light source unit 20 to irradiate light emitted from the light-emitting diode element 102. Therefore, the lens 204 projects a shape of the side 310 of the light-emitting face 116 on an upper side position of the area 306.

In addition, the lens 204 forms at least a part of the upper side of the area 306 on the position where at least a part of the level cut line 302 should be formed. In this way, the light source unit 20 forms at least a part of the level cut line 302 based on a border between bright and dark sides formed by the area 306. According to this example, the light distribution pattern can be formed adequately.

Figure 10:
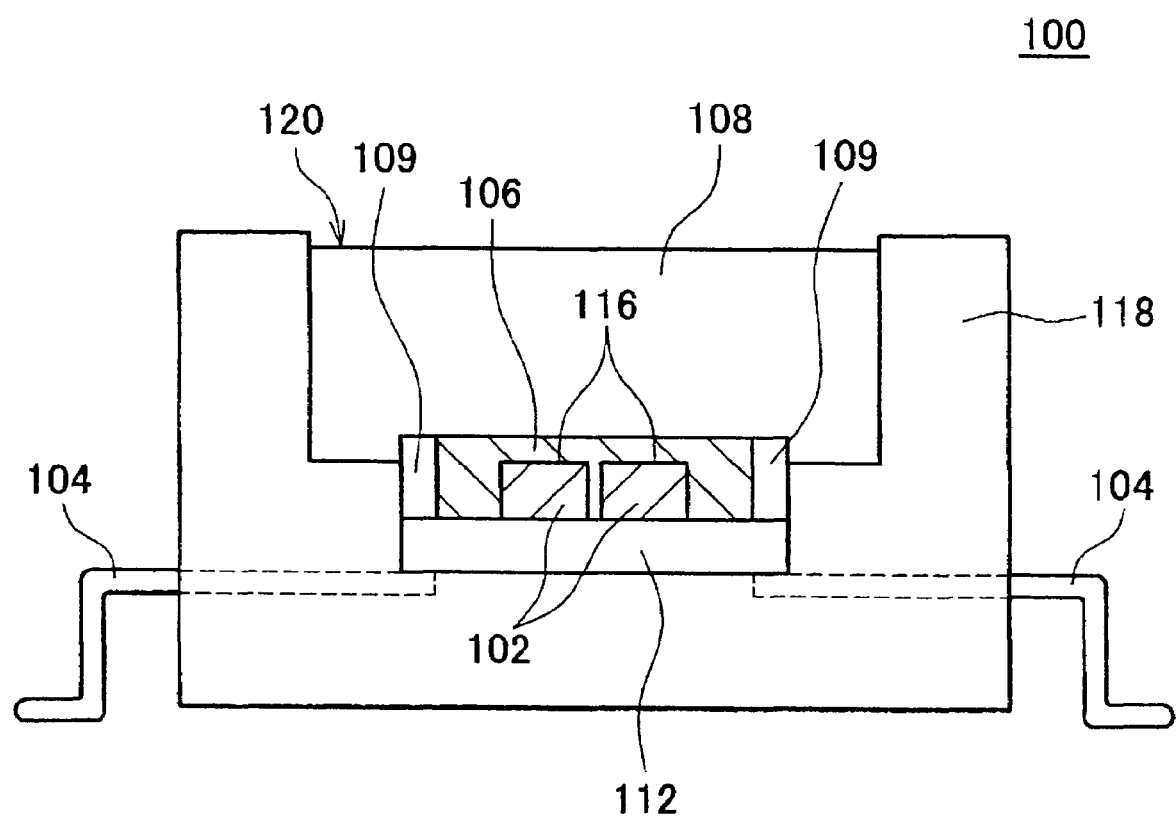
FIG. 10 is a view showing another example of a configuration of the LED module.

FIG. 10 is a view showing another example of a configuration of the LED module 100. Here, the explanation of the configuration of FIG. 10 having the same reference number as FIG. 3 will be omitted except the components that are below explained because the configuration of the same reference number has the same function. In this example, the LED module 100 has a plurality of light-emitting diode elements 102. The phosphor layer 106 is provided to cover the plurality of light-emitting diode elements 102. The sealing member 108 seals the plurality of light-emitting diode elements 102 and the phosphor layer 106.

In addition, the sub-wavelength grating 132 (see FIG. 4) is formed on the facing face 110 (see FIG. 4) of the sapphire substrate 410 in each of the light-emitting diode elements 102. Therefore, in this example, the light-emitting diode element 102 can efficiently emit light to the phosphor layer 106 and the sealing member 108.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. A light-emitting module that emits light, comprising:
   a semiconductor light-emitting element operable to emit light; and
   a sealing member operable to seal said semiconductor light-emitting element with materials that transmit the light emitted from said light-emitting module, wherein
   said semiconductor light-emitting element comprises:
   a sapphire substrate that transmits light toward said sealing member, the transmitted light sent from a facing face of the sapphire substrate facing said sealing member,
   a sub-wavelength grating for reducing reflection of light provided on the facing face in grid periods shorter than a wavelength of the light transmitted through said sapphire substrate, and
   a semiconductor layer that is formed on a rear face opposing the facing face in said sapphire substrate by crystal growth and emits light toward said sapphire substrate; wherein
   the sub-wavelength grating includes a plurality of convex portions protruding in the direction perpendicular to the facing face,
   the plurality of convex portions is arranged in grating intervals shorter than half-wavelength of the light transmitted through said sapphire substrate, and
   the height of the convex portion is longer than half-wavelength of the light transmitted through said sapphire substrate.

2. A light-emitting module as claimed in claim 1, wherein said semiconductor layer emits ultraviolet rays toward said sapphire substrate,
   said sapphire substrate transmits the ultraviolet rays emitted from said semiconductor layer to send the rays from the facing face to said sealing member,
   said light-emitting module further comprises a phosphor layer for generating visible light by fluorescent effect according to the ultraviolet rays emitted from said semiconductor layer, said phosphor layer is provided on the facing face of said sapphire substrate,
   said sealing member is positioned to face the facing face of said sapphire substrate while putting said phosphor layer therebetween,
   said phosphor layer has a refractive index smaller than that of said sapphire substrate,
   the grating intervals of the plurality of convex portions are smaller than half-wavelength of the ultraviolet rays transmitted through said sapphire substrate, and
   the height of the convex portion is longer than half-wavelength of the ultraviolet rays transmitted through said phosphor layer.

3. A light-emitting module as claimed in claim 1, wherein said semiconductor layer emits blue light toward said sapphire substrate,
   said sapphire substrate transmits the blue light emitted from said semiconductor layer to send the light from the facing face to said sealing member, said light-emitting module further comprises a phosphor layer for generating yellow light by fluorescent effect according to the blue light emitted from said semiconductor layer, said phosphor layer is provided on the facing face of said sapphire substrate, said sealing member is positioned to face the facing face of said sapphire substrate while putting said phosphor layer therebetween, said phosphor layer has a refractive index smaller than that of said sapphire substrate, the grating intervals of the plurality of convex portions are smaller than half-wavelength of the blue light transmitted through said sapphire substrate, and the height of the convex portion is longer than half-wavelength of the blue light transmitted through said phosphor layer.

4. A light-emitting module as claimed in claim 1, wherein a refractive index of said sealing member is larger than that of air and not greater than 1.4, and said sealing member has an outgoing face parallel to the facing face of said sapphire substrate and sends the light incident from said sapphire substrate to the outside of said light-emitting module via the outgoing face.

5. A light-emitting module as claimed in claim 1, wherein said semiconductor layer emits ultraviolet rays toward said sapphire substrate, said sapphire substrate transmits the ultraviolet rays emitted from said semiconductor layer to send the rays from the facing face to said sealing member, said light-emitting module further comprises a phosphor layer for generating visible light by fluorescent effect according to the ultraviolet rays emitted from said semiconductor layer, said phosphor layer is provided on the facing face of said sapphire substrate, a refractive index of said phosphor layer is smaller than that of said sapphire substrate and larger than that of said sealing member, and said sealing member is formed of silicone resin or fluorine resin.

6. A lamp that emits light, comprising:
a light-emitting module operable to emit light; and
an optical member operable to irradiate light emitted from said light-emitting module to the outside of the lamp, wherein
said light-emitting module comprises:
a semiconductor light-emitting element operable to emit light; and
a sealing member operable to seal said semiconductor light-emitting element with materials that transmit the light emitted from said light-emitting module,
said semiconductor light-emitting element comprises:
a sapphire substrate that transmits light toward said sealing member, the transmitted light sent from a facing face of the sapphire substrate facing said sealing member,
a sub-wavelength grating for reducing reflection of light formed on the facing face in grid periods shorter than a wavelength of the light transmitted through said sapphire substrate, and
a semiconductor layer that is formed on a rear face opposing the facing face in said sapphire substrate by crystal growth and emits light toward said sapphire substrate; wherein
the sub-wavelength grating includes a plurality of convex portions protruding in the direction perpendicular to the facing face, the plurality of convex portions is arranged in grating intervals shorter than half-wavelength of the light transmitted through said sapphire substrate, and the height of the convex portion is longer than half-wavelength of the light transmitted through said sapphire substrate.

7. A lamp as claimed in claim 6, wherein
said lamp is a lamp used for a headlight of a vehicle,
a refractive index of said sealing member is larger than that of air and not greater than 1.4,
said sealing member has an outgoing face parallel to the facing face of said sapphire substrate and sends the light incident from said sapphire substrate to the outside of said light-emitting module via the outgoing face, and
said optical member forms at least a part of cut line that defines borders between bright and dark sides of a light distribution pattern of the headlight by projecting a shape of the facing face of said sapphire substrate.

8. A light-emitting module that emits light, comprising:
a semiconductor light-emitting element operable to emit light; and
a sealing member operable to seal said semiconductor light-emitting element with materials that transmit the light emitted from said light-emitting module, wherein
said semiconductor light-emitting element comprises:
a sapphire substrate that transmits light toward said sealing member, the transmitted light sent from a facing face of the sapphire substrate facing said sealing member,
a sub-wavelength grating for reducing reflection of light provided on the facing face in grid periods shorter than a wavelength of the light transmitted through said sapphire substrate, and
a semiconductor layer that is formed on a rear face opposing the facing face in said sapphire substrate and emits light toward said sapphire substrate; wherein
sub-wavelength grating includes a plurality of convex portions protruding in the direction perpendicular to the facing face,
the plurality of convex portions is arranged in grating intervals shorter than half-wavelength of the light transmitted through said sapphire substrate, and
the height of the convex portion is longer than half-wavelength of the light transmitted through said sapphire substrate.

9. A light-emitting module as claimed in claim 8, wherein said semiconductor layer emits ultraviolet rays toward said sapphire substrate, said sapphire substrate transmits the ultraviolet rays emitted from said semiconductor layer to send the rays from the facing face to said sealing member, said light-emitting module further comprises a phosphor layer for generating visible light by fluorescent effect according to the ultraviolet rays emitted from said semiconductor layer, said phosphor layer is provided on the facing face of said sapphire substrate, said sealing member is positioned to face the facing face of said sapphire substrate while putting said phosphor layer therebetween, said phosphor layer has a refractive index smaller than that of said sapphire substrate, the grating intervals of the plurality of convex portions are smaller than half-wavelength of the ultraviolet rays transmitted through said sapphire substrate, and the height of the convex portion is longer than half-wavelength of the ultraviolet rays transmitted through said phosphor layer.

10. A light-emitting module as claimed in claim 8, wherein said semiconductor layer emits blue light toward said sapphire substrate, said sapphire substrate transmits the blue light emitted from said semiconductor layer to send the light from the facing face to said sealing member, said light-emitting module further comprises a phosphor layer for generating yellow light by fluorescent effect according to the blue light emitted from said semiconductor layer, said phosphor layer is provided on the facing face of said sapphire substrate, said sealing member is positioned to face the facing face of said sapphire substrate while putting said phosphor layer therebetween, said phosphor layer has a refractive index smaller than that of said sapphire substrate, the grating intervals of the plurality of convex portions are smaller than half-wavelength of the blue light transmitted through said sapphire substrate, and the height of the convex portion is longer than half-wavelength of the blue light transmitted through said phosphor layer.

11. A light-emitting module as claimed in claim 8, wherein a refractive index of said sealing member is larger than that of air and not greater than 1.4, and said sealing member has an outgoing face parallel to the facing face of said sapphire substrate and sends the light incident from said sapphire substrate to the outside of said light-emitting module via the outgoing face.

12. A light-emitting module as claimed in claim 8, wherein said semiconductor layer emits ultraviolet rays toward said sapphire substrate, said sapphire substrate transmits the ultraviolet rays emitted from said semiconductor layer to send the rays from the facing face to said sealing member, said light-emitting module further comprises a phosphor layer for generating visible light by fluorescent effect according to the ultraviolet rays emitted from said semiconductor layer, said phosphor layer is provided on the facing face of said sapphire substrate, a refractive index of said phosphor layer is smaller than that of said sapphire substrate and larger than that of said sealing member, and said sealing member is formed of silicone resin or fluorine resin.

* * * * *